United States Patent [19]
van de Water et al.

[11] Patent Number: 5,703,401
[45] Date of Patent: *Dec. 30, 1997

[54] MINIATURE SEMICONDUCTOR DEVICE FOR SURFACE MOUNTING

[75] Inventors: Peter W. M. van de Water; Roelf A. J. Groenhuis; Cornelis G. Schriks, all of Nijmegen, Netherlands

[73] Assignee: U.S. Philips Corporation, New York, N.Y.

[*] Notice: The term of this patent shall not extend beyond the expiration date of Pat. No. 5,198,386.

[21] Appl. No.: 644,093

[22] Filed: May 10, 1996

[30] Foreign Application Priority Data

May 10, 1995 [EP] European Pat. Off. ............. 95201203

[51] Int. Cl.⁶ .................... H01L 23/34; H01L 23/48; H01L 23/52; H01L 23/02
[52] U.S. Cl. ............... 257/727; 237/678; 237/692
[58] Field of Search ..................... 257/678, 692, 257/727

[56] References Cited

U.S. PATENT DOCUMENTS 5,198,886  3/1993  Verspeek et al. ............... 257/727

Primary Examiner—Mahshid D. Saadat
Assistant Examiner—T. M. Arroyo
Attorney, Agent, or Firm—Norman N. Spain

[57] ABSTRACT

The invention relates to a semiconductor device for surface mounting with a substrate carrier having a surface provided with a groove with walls on which conductor tracks are present, which conductor tracks continue on the surface of the substrate carrier and form connection conductors of the device which is provided with a semiconductor element arranged in the groove with its main surface parallel to a wall which semiconductor element makes electrical contact with the conductor tracks on the wall, while the groove is filled with a protective material and the substrate carrier is provided with a side wall interconnecting mutually opposed walls of the groove on either side of the semiconductor element.

5 Claims, 2 Drawing Sheets

MINIATURE SEMICONDUCTOR DEVICE FOR SURFACE MOUNTING

BACKGROUND OF THE INVENTION

The invention relates to a semiconductor device for surface mounting with a substrate carrier having a surface provided with a groove with walls on which conductor tracks are present, which conductor tracks continue onto the surface of the substrate carrier and form connection conductors of the device, which device is provided with a semiconductor element arranged with its main surface parallel to a wall in said groove, while the semiconductor element is in electrical contact with the conductor tracks on the wall and the groove is filled with a protective material. The invention also relates to a carrier rod suitable for manufacture of the semiconductor device.

U.S. Pat. No. 5,198,886 describes a device of the kind mentioned in the opening paragraph. The known device is suitable for surface mounting, i.e. the conductor tracks continuing over the surface of the substrate carrier are used for effecting a connection between the semiconductor device and, for example, conductor tracks on a printed circuit board. The semiconductor element is held clamped in in a tapering groove in the known device.

Although the known device is satisfactory in practice, it is found for very small dimensions such as are necessary with increasing miniaturization that problems arise involving reject devices during and after manufacture.

SUMMARY OF THE INVENTION

The invention has for its object inter alia to provide a semiconductor device which leads to fewer rejects during and after manufacture in combination with small dimensions.

According to the invention, the device is for this purpose characterized in that the substrate carrier is provided with a side wall which interconnects mutually opposed walls of the groove.

It is achieved thereby that there are considerably fewer rejects during and after the manufacture of small semiconductor devices.

The invention is based on the following recognition. A continuous groove is used in the known device, i.e. the substrate carrier effectively comprises two halves, material of the substrate carrier forming a mechanical connection between the two halves below the bottom of the groove. A semiconductor element is introduced into the groove with clamping fit during manufacture of the known device. The material below the groove bottom is mechanically loaded thereby. It is found that rejects occur during and after manufacture of known devices of small dimensions because the material below the bottom is not strong enough. The measure according to the invention provides additional mechanical connections between the two halves of the substrate carrier. Apart from the material below the groove bottom, the side walls also provide mechanical connections between the two substrate carrier halves, so that no rejects occur in the case of small dimensions of the semiconductor device when the quantity of material below the groove is small because of a small height of the semiconductor device. The use of side walls on either side of the semiconductor element leads to a closed system of forces between the two halves and the side walls. Such a closed system of forces is highly capable of absorbing forces during and after manufacture.

An additional advantage is obtained when the groove has no bottom. The dimensions of the device may be chosen to be even smaller then. The closed system of forces with two side walls and two substrate halves then ensures a sufficient mechanical stiffness in spite of the absence of material below the groove bottom.

The side wall between the substrate halves may be provided as a separate component on the substrate carrier. Preferably, the device according to the invention is characterized in that the side wall is integral with the substrate carrier. This means that the side walls comprise the same material as the substrate carrier. The side wall will then be formed during the manufacture of the substrate carrier itself. The cost of side walls then remains very limited.

Preferably, the substrate carrier is manufactured from a synthetic resin or a ceramic material. It is possible then to manufacture the substrate carrier with side walls in a simple manner in an injection-moulding or extrusion process.

The invention also relates to a carrier rod suitable for the manufacture of a semiconductor device for surface mounting with a surface provided with a groove having walls on which conductor tracks are present, which conductor tracks continue onto the surface of the carrier rod. U.S. Pat. No. 5,198,886 shows how such a carrier rod is used for manufacturing semiconductor elements. The semiconductor elements are introduced into the groove with clamping fit, so that the semiconductor elements make electrical contact with the conductor tracks on the walls. The semiconductor elements are subsequently fixed, for example, by means of a soldering process. The semiconductor elements are subsequently covered with a protective material in the groove. Then the carrier rod is subdivided into individual semiconductor devices, by sawing or breaking. According to the invention, the groove in the carrier rod is subdivided into compartments which are mutually separated by side walls. Owing to the use of such a carrier rod, the carrier rod is much stronger during the insertion of the semiconductor elements into the groove, so that fewer rejects will occur owing to fracture of the carrier rod or an insufficient clamping force.

BRIEF DESCRIPTION OF THE DRAWINGS

The invention will be explained in more detail below by way of example with reference to a drawing in which.

The Figures are purely diagrammatic and not drawn to scale. Corresponding parts have been given the same reference numerals in general in the Figures.

DETAILED DESCRIPTION OF THE PREFERRED EMBODIMENTS

Figure 1:
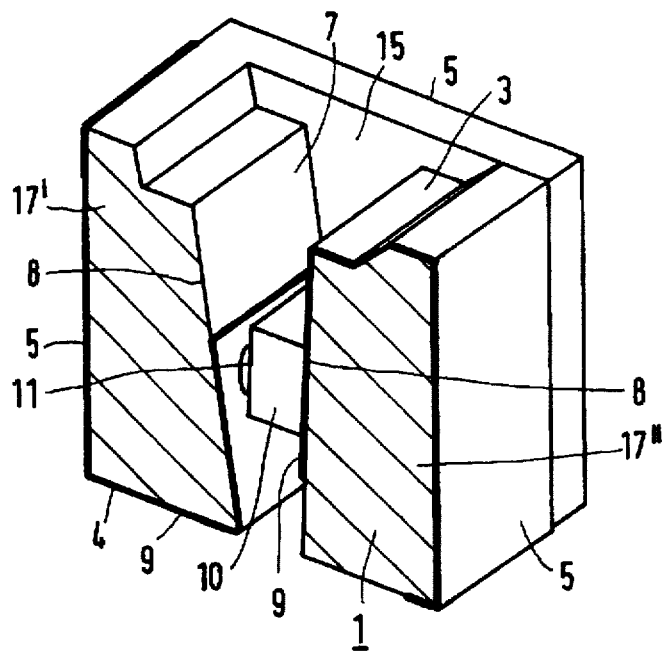
FIGS. 1 and 2 show an embodiment of a device according to the invention, FIG. 1 being a cross-sectional view.
Figure 2:
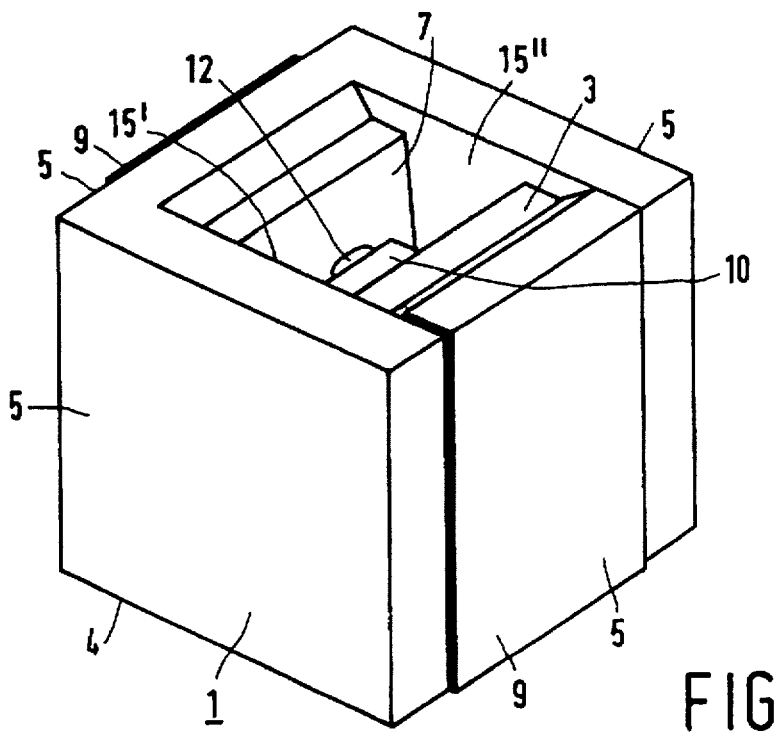

FIGS. 1 and 2 show a cross-section and a perspective view of a semiconductor device for surface mounting provided with a substrate carrier 1 having a surface. The surface here comprises an upper surface 3, lower surface 4, and side surfaces 5. The upper surface 3 is provided with a tapering groove 7 with walls 8 which enclose an angle of approximately 13°. Conductor tracks are present on the walls 8 and continue onto the surface, in this case onto the upper surface 3, the lower surface 4, and side surfaces 5 of the substrate carrier 1. The conductor tracks 9 form connection conductors of the device on the upper surface 3, lower surfaces 4, and side surfaces 5. During mounting, the device is mounted on a printed circuit board, for example with a lower surface 4, and the conductor tracks 9 are connected to conductor tracks on the printed circuit board by soldering. Obviously, the semiconductor device may alternatively be mounted with a side surface 5 or with an upper surface 3. The device is provided with a semiconductor element 10 which is introduced into the groove 7 with its main surface 11 parallel to a wall 8. The main surface of the semiconductor element is here understood to mean a surface which corresponds to a main surface of the semiconductor wafer from which the semiconductor element was manufactured. Given such a positioning, contacts 12 can be provided on the semiconductor element while it is still on the wafer, which contacts connect with the conductor tracks on the wall 8. In other words, the non-main surfaces of the semiconductor element 10 correspond to breaking or sawing surfaces created in splitting-up of the semiconductor wafer. The semiconductor element 10 makes electrical contact with the conductor tracks 9 on the wall 8, in this case via a deformable contact body 12 in the form of a so-called bump contact, manufactured in known manner by wire bonding. The groove 7 is filled up with a protective material, such as an epoxy lacquer or a glass layer (not shown).

According to the invention, the substrate carrier 1 is provided with side walls 15', 15" on either side of the semiconductor element 10, these; side walls interconnecting mutually opposed walls 8 of the groove 7. A closed system of forces is thus created between the two halves 17', 17" of the substrate carrier 1 and the side walls 15', 15". Such a closed system of forces is capable of absorbing forces such as those which occur during and after manufacture. The groove 7 in the embodiment has no bottom. The closed system of forces with two side walls 15', 15" and two substrate halves 17', 17" ensures a sufficient mechanical stiffness in spite of the absence of material below the bottom of the groove 7. The dimensions of the device may be chosen to be very small then. Thus a semiconductor device of FIGS. 1 and 2 has dimensions L×W×H of 0.6×1.0×0.7 mm (known as 0402 in SMD technology).

Figure 3:
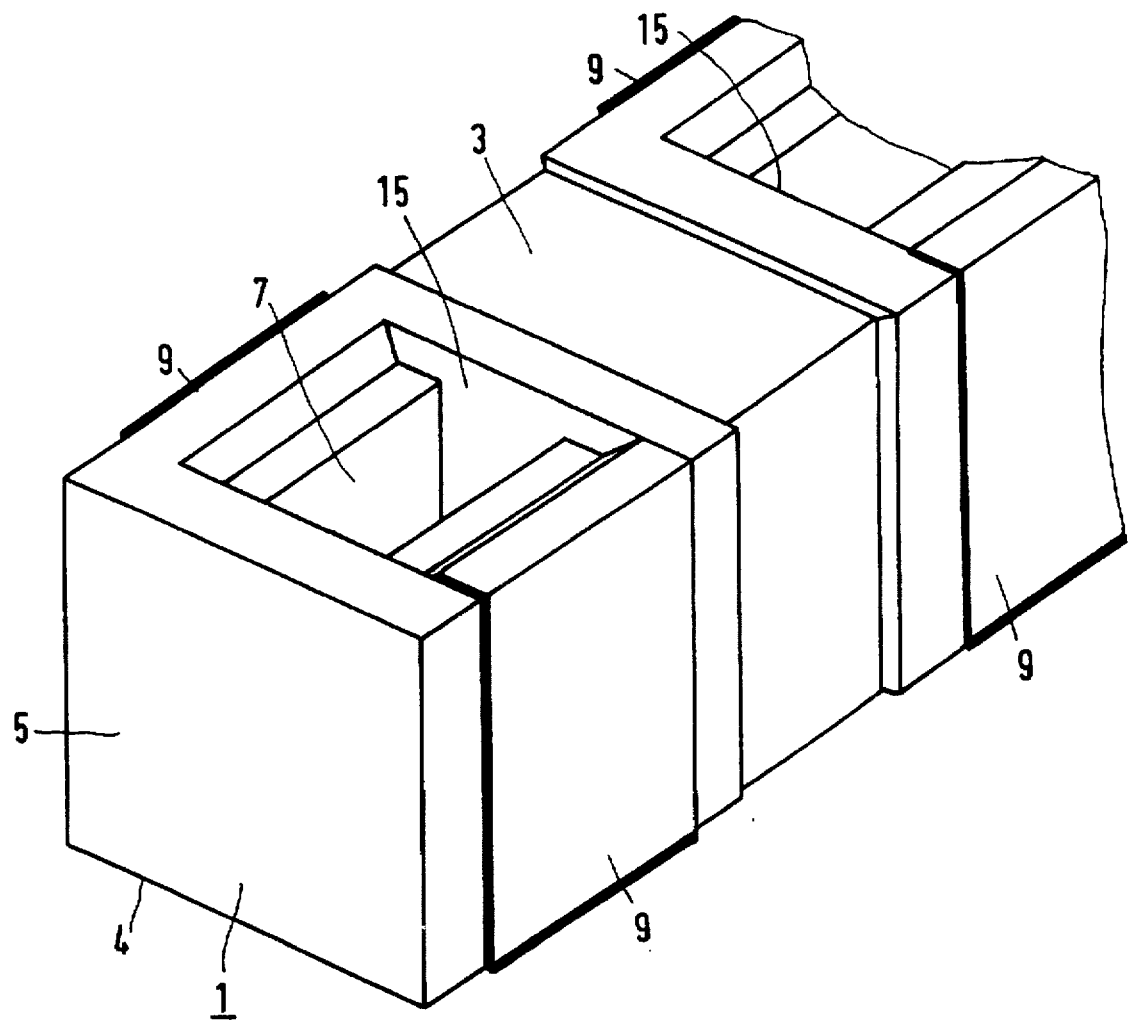
FIG. 3 shows a portion of a carrier rod for use during the manufacture of the semiconductor device according to the invention.

The semiconductor device is manufactured in a manner analogous to that described in U.S. Pat. No. 5,198,886. The method starts with a carrier rod 1 having a groove 7 with walls 8 on which the conductor tracks 9 are provided (see FIG. 3). These conductor tracks comprise, for example, a solder layer. The semiconductor elements 10 are provided with a solder layer on a first main surface and with a deformable contact body 12 of gold on the other main surface and are subsequently introduced with clamping fit into the groove 7, such that the semiconductor elements 10 make electrical contact with the conductor tracks 9 on the walls 8. In this example, the clamping force is substantially provided by the deformable contact body 12. The semiconductor element 10 is subsequently given an extra fixation by soldering. The semiconductor elements 10 in the groove 7 are then covered with a known epoxy lacquer or glass suspension in order to protect the semiconductor elements 10 from ambient influences such as, for example, moisture. Then the carrier rod 1 is split up into individual semiconductor devices by, for example, sawing or breaking. Further details on the semiconductor device and the method of manufacturing it can be found in U.S. Pat. No. 5,198,886. Before the semiconductor elements 10 are introduced into the groove 7, the carrier rod 1 is provided with the side walls 15. The side walls 15 may be provided on the carrier rod 1 as additional components. FIG. 3 shows an advantageous embodiment of the carrier rod 1 where the side walls 15 are integrally included in the carrier rod 1. The carrier rod 1 comprises a groove 7 which is subdivided into compartments by side walls 15. The side walls 15 comprise the same material as the carrier rod 1. This carrier rod 1 is now used for manufacturing devices in accordance with the embodiment. Preferably, the carrier rod 1 is manufactured from a synthetic resin or ceramic material, for example from a polyether sulphon (PES), polyether imide (PEI), silicon carbide (SiC), silicon nitride, or alumina. It is then possible to manufacture the substrate carrier with side walls in a simple manner by means of an injection moulding or extrusion process, possibly followed by sintering in the case of ceramic materials. The side walls 15 will be formed simultaneously during the manufacture of the carrier rod 1. The cost of side walls 15 will then remain very limited.

The invention is not limited to the embodiment described above. Thus the groove 7 has no bottom in the embodiment of FIGS. 1 and 2. It will be obvious that the groove 7 may very well be provided with material below the bottom of the groove 7. The semiconductor device will then have slightly larger dimensions, but, for example, covering of the semiconductor element in the groove 7 becomes simpler because only one upper side 3 of the groove 7 need be covered. In the embodiment, a conductor track 9 on wall 8 first continues to the upper surface 3, then to a side surface 5, and finally to the lower surface 4, while a further conductor track 9 on the other, opposed wall 5 first continues to the lower surface 4 and then to a side surface 5. It is equally well possible for both conductor tracks 9 on the walls 8 of the groove 7 to continue first to the upper side 3 of the substrate carrier 1 and then to the side surfaces 5 and the lower side 4, or inversely to first continue to the lower side 4 of the substrate carrier 1 and then to the side surfaces 5 and the upper side 3. It is also possible for the conductor tracks 9 to continue only onto the upper surface 3 or the lower surface 4. So the conductor tracks 9 need not cover the side surfaces 5. It is sufficient for achieving an electrical contact with conductor tracks on a printed circuit board when a portion of the upper or lower surface 3, 4 of the substrate carrier 1 is covered with the conductor tracks 9. The contact body 12 in the embodiment was manufactured by wire bonding. It is alternatively possible to manufacture contact bodies 12 by other techniques such as, for example, selective growth by electroplating, or by electrochemical deposition of a layer and patterning of this layer by photolithography. The semiconductor element 10 in the groove 7 may comprise several semiconductor elements 10 such as, for example, a diode, transistor, or IC. The wall 8 in that case comprises a number of conductor tracks 9 adapted to the specific semiconductor element 10. Thus, for example, one conductor track will be present on each wall 8 in the case of a diode, whereas one conductor track will be necessary on one wall 8 and two conductor tracks 9 on the other wall 8 in the case of a transistor. The semiconductor device may also comprise several semiconductor elements 10. Such a device may be manufactured very simply in that, during breaking up of the carrier rod 1 provided with semiconductor elements 10, this carrier rod 1 is not subdivided into semiconductor devices comprising one semiconductor element 10 each, but two or more semiconductor elements 10 each.

What is claimed is:

1. A semiconductor device for surface mounting, the semiconductor device being provided with a semiconductor element, the device comprising: a substrate carrier having a surface provided with a groove with walls on which conductor tracks are present, which conductor tracks continue onto the surface of the substrate carrier and form connection conductors of the device, the semiconductor element being arranged with its main surface parallel to a wall in said groove, and being in electrical contact with the conductor tracks on the wall, the groove being filled with a protective material, and the substrate carrier being provided with a side wall which mechanically interconnects and supports mutually opposed walls of the groove.

2. A semiconductor device as claimed in claim 1, characterized in that the groove has no bottom.

3. A semiconductor device as claimed in any one of the preceding claims, characterized in that the side wall is integral with the substrate carrier.

4. A semiconductor device as claimed in any one of the preceding claims, characterized in that the substrate carrier is manufactured from a ceramic material or a synthetic resin.

5. A carrier rod suitable for the manufacture of a semiconductor device for surface mounting with a surface, the carrier rod comprising a groove having walls on which conductor tracks are present, which conductor tracks continue onto the surface of the carrier rod, and the groove in the carrier rod being subdivided into compartments which are mutually separated by side walls.

* * * * *